United States Patent
Strong et al.

(10) Patent No.: US 9,991,864 B2
(45) Date of Patent: Jun. 5, 2018

(54) SUPERCONDUCTING LOGIC COMPATIBLE PHASE SHIFTER

(71) Applicant: Microsoft Technology Licensing, LLC, Redmond, WA (US)

(72) Inventors: Joshua A. Strong, Columbia, MD (US); Ofer Naaman, Ellicott City, MD (US); Jonathan D. Egan, Hanover, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 521 days.

(21) Appl. No.: 14/883,237

(22) Filed: Oct. 14, 2015

(65) Prior Publication Data

US 2017/0201224 A1    Jul. 13, 2017

(51) Int. Cl.
*H01L 39/02* (2006.01)
*H03H 7/20* (2006.01)
*H01P 5/12* (2006.01)

(52) U.S. Cl.
CPC ............. *H03H 7/20* (2013.01); *H01L 39/025* (2013.01); *H01P 5/12* (2013.01)

(58) Field of Classification Search
CPC ................................ H01L 39/025; H01P 5/12
See application file for complete search history.

(56) References Cited

U.S. PATENT DOCUMENTS

| | | |
|---|---|---|
| 3,560,891 A | 2/1971 | Macleay et al. |
| 5,153,171 A | 10/1992 | Smith et al. |
| 6,608,581 B1 | 8/2003 | Semenov |
| 7,298,217 B2 | 11/2007 | Adlerstein et al. |
| 9,059,674 B2 * | 6/2015 | Chow .................. G06N 99/002 |
| 9,509,274 B2 * | 11/2016 | Naaman ..................... H01P 1/18 |
| 9,520,547 B2 * | 12/2016 | Abraham .............. H01L 39/223 |
| 2005/0206376 A1 * | 9/2005 | Matthews .............. B82Y 35/00 |
| | | 324/248 |

(Continued)

FOREIGN PATENT DOCUMENTS

WO            3090162 A2     10/2003

OTHER PUBLICATIONS

Li, et al., "A 57-to-64 GHz Ultra-Compact 0.027 mm2 Reflection Type Phase shifter with Low Insertion Loss", Proceedings of 44th European Microwave Conference, Oct. 6, 2014, pp. 1734-1737.

(Continued)

*Primary Examiner* — Colleen P Dunn
(74) *Attorney, Agent, or Firm* — Singh Law, PLLC; Ranjeev Singh

(57) ABSTRACT

A phase shifter, including two superconducting circuits, is provided. Each of the superconducting circuits includes at least one capacitor coupled in parallel to at least a Josephson junction and at least one inductor, where a respective inductance of each of the Josephson junctions (e.g., a first Josephson junction and a second Josephson junction) is a function of at least a current flow through each of the respective inductors. An effect of any or both of: (1) at least the inductance of the at least the first Josephson junction and (2) at least the inductance of the at least the second Josephson junction causes a phase change of a radio frequency signal received at a first terminal of the phase shifter to generate a phase-shifted radio frequency signal at a second terminal of the phase shifter.

20 Claims, 7 Drawing Sheets

(56) References Cited

U.S. PATENT DOCUMENTS

2005/0242902 A1    11/2005    Kozyrev et al.

OTHER PUBLICATIONS

Yang, et al., "A Novel Design of Reflection-type Phase Shifter for Microwave Life-Detection System", Proceedings of USNC-URSI Radio Science Meeting (Joint with AP-S Symposium), Jul. 6, 2014, pp. 212.

Cheng, et al., "High Performance 1.8-2.4 GHz Phase Shifter using Silicon-on-Sapphire Digitally Tunable Capacitors", Proceedings of IEEE MTT-S International Microwave Symposium Digest, Jun. 2, 2013, 3 pages.

Abbosh, Amin M., "Compact Tunable Reflection Phase Shifters Using Short Section of Coupled Lines", IEEE Transactions on Microwave Theory and Techniques, vol. 60, Issue 8, Aug. 2012, pp. 2465-2472.

Rosu, Iulian, "Phase Shifters", Published on: Aug. 17, 2011 Available at: http://www.qsl.net/va3iul/Phase_Shifters/Phase_Shifters.pdf.

Takemoto-Kobayashi, et al., "Monolithic High-Tc Superconducting Phase Shifter at 10 GHz", IEEE Transactions on Microwave Theory and Techniques, vol. 40, Issue 12, Dec. 1992, pp. 2339-2344.

Durand, et al., "The Distributed Josephson Inductance Phase Shifter", IEEE Transactions on Applied Superconductivity, vol. 2, Issue 1, Mar. 1992, pp. 33-38.

Ustinov, Alexey, "Development of RF Sensor Based on Two Cell SQUID", In Technical Report AFRL-AFOSR-UK-TR-2010-0011, Jun. 2010, 13 pages.

Sandberg, et al., "Tuning the Field in a Microwave Resonator Faster than the Photon Lifetime", In Applied Physics Letters, vol. 92, May 19, 2008, 2 pages. abstract only.

Yin, et al., "A Wide-Band Tunable Phase Shifter for Radio-Frequency Reflectometry", Published on: Dec. 2014 Available at: http://arxiv.org/ftp/arxiv/papers/1412/1412.4200.pdf.

Strong, Joshua A., "The Tunable Josephson Resonator and its Application to Superconducting Quantum Computation," Ph.D. Dissertation, Feb. 2009.

Brummer et al., "Phase and Amplitude Modulator for Microwave Pulse Generation," IEEE Transactions on Applied Superconductivity, vol. 21, No. 3, Jun. 2011, pp. 583-586.

Rigetti, Chad Tyler, "Quantum Gates for Superconducting Qubits," Ph.D. Dissertation, May 2009.

Ohki et al., "Picosecond On-Chip Qubit Control Circuitry," IEEE Transactions on Applied Superconductivity, vol. 14, No. 2, Jun. 2005, pp. 837-840.

Kokkala, Janne, "Quantum Computing with Itinerant Microwave Photons," Master's Thesis, Mar. 27, 2013.

Raihan et al., "Superconducting Integrated Microwave I-Q Modulator for Qubit Control," Abstracts from the Electronics Sessions, Aug. 18, 2008, Session 3EY02.

Jenks, et al., "SQUIDs for Nondestructive Evaluation", In Journal of Physics D: Applied Physics, vol. 30, Issue 3, Feb. 7, 1997, pp. 293-323.

Muck, et al., "Progress in RF-SQUIOs", In the Proceedings of IEEE Transactions on Applied Superconductivity, vol. 3 Issue 1, Mar. 1, 1993, 8 Pages.

"International Search Report and Written Opinion Issued in PCT Application No. PCT/US2016/052378", dated Dec. 12, 2016, 13 Pages.

Sadeghi, et al., "Crosstalk Suppression and High-Fidelity Measurement in 2-D Tunneling of Coupled Josephson Junctions", In the Proceedings of IEEE Transactions on Applied Superconductivity, vol. 22, No. 4, Aug. 4, 2012, 10 Pages.

"Second Written Opinion Issued in PCT Application No. PCT/US2016/052378", dated Sep. 22, 2017, 6 Pages.

"International Preliminary Report on Patentability Issued in PCT Application No. PCT/US2016/052378", dated Jan. 22, 2018, 7 Pages.

* cited by examiner

SUPERCONDUCTING LOGIC COMPATIBLE PHASE SHIFTER

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption, at high clock speeds, by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An alternative approach to the use of processors, and related components, based on CMOS technology, is the use of superconducting logic based devices. Microwave signals may be used as control signals for the superconducting logic based devices.

SUMMARY

In one example, the present disclosure relates to a phase shifter including: (1) a first superconducting circuit including at least a first capacitor coupled in parallel to at least a first Josephson junction and at least a first inductor coupled in parallel to the at least the first Josephson junction, where an inductance of the at least the first Josephson junction is a function of at least an amount of a first current flow through the at least the first inductor, and (2) a second superconducting circuit including at least a second capacitor coupled in parallel to at least a second Josephson junction and at least a second inductor coupled in parallel to the at least the second Josephson junction, where an inductance of the at least the second Josephson junction is a function of at least an amount of a second current flow through the at least the second inductor. An effect of any or both of: (1) at least the inductance of the at least the first Josephson junction and (2) at least the inductance of the at least the second Josephson junction causes a phase change of a radio frequency signal received at a first terminal of the phase shifter to generate a phase-shifted radio frequency signal at a second terminal of the phase shifter.

In another aspect, a superconducting integrated circuit including a phase shifter and a mixer is provided. The phase shifter may include a first superconducting circuit and a second superconducting circuit. The first superconducting circuit may further include at least a first capacitor coupled in parallel to at least a first Josephson junction and at least a first inductor coupled in parallel to the at least the first Josephson junction, where an inductance of the at least the first Josephson junction is a function of at least a first portion of a phase control current flow through the at least the first inductor. The second superconducting circuit may include at least a second capacitor coupled in parallel to at least a second Josephson junction and at least a second inductor coupled in parallel to the at least the second Josephson junction, where an inductance of the at least the second Josephson junction is a function of at least a second portion of the phase control current flow through the at least the second inductor. An effect of any or both of: (1) at least the inductance of the at least the first Josephson junction and (2) at least the inductance of the at least the second Josephson junction causes a phase change of a radio frequency signal received at a first terminal of the phase shifter to generate a phase-shifted radio frequency signal at a second terminal of the phase shifter. The mixer may receive the phase-shifted radio frequency signal at a first terminal of the mixer and an amplitude control current at a second terminal of the mixer and may provide a modulated radio frequency signal at a third terminal of the mixer.

In yet another aspect, a phase shifter including a hybrid coupler, a first variable reactance circuit, and a second variable reactance circuit is provided. The hybrid coupler may include a first terminal, a second terminal, a third terminal, and a fourth terminal. The first variable reactance circuit, coupled to the first terminal of the hybrid coupler, may include at least a first capacitor coupled in parallel to at least a first Josephson junction, at least a first inductor coupled in parallel to at least the first Josephson junction, wherein the at least the first inductor is magnetically coupled to at least a second inductor such that a first combined effect of a common current and a differential current supplied to the at least the second inductor causes a first change in an inductance of the at least the first Josephson junction. The second variable reactance circuit, coupled to the second terminal of the hybrid coupler, may include at least a second capacitor coupled in parallel to at least a second Josephson junction, at least a third inductor coupled in parallel to at least the second Josephson junction, wherein the at least the third inductor is magnetically coupled to the at least a fourth inductor such that a second combined effect of the common current and the differential current supplied to the at least the fourth inductor causes a second change in an inductance of the at least the second Josephson junction. An effect of any or both of: (1) at least the first change in the inductance of the at least the first Josephson junction, and (2) at least the second change in the inductance of the at least the second Josephson junction may cause a phase change of a radio frequency signal received via the third terminal of the hybrid coupler to provide a phase-shifted radio frequency signal via the fourth terminal of the hybrid coupler.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
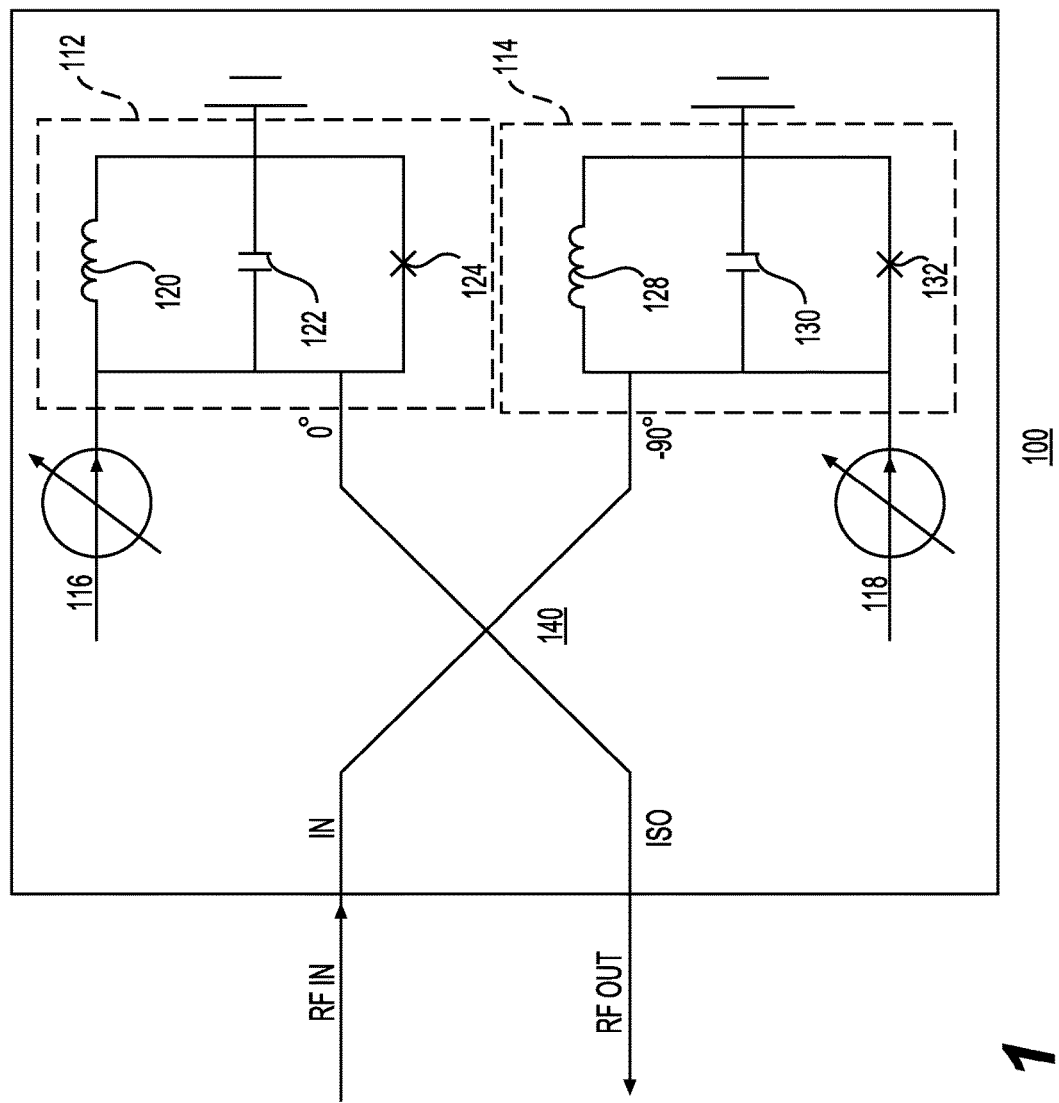
FIG. 1 shows a schematic diagram of an exemplary superconducting compatible logic phase shifter.

Examples described in this disclosure relate to superconducting logic compatible control devices, including phase shifters. In some examples, such phase shifters may be used for vector modulation of a microwave signal. Such microwave signals may be used to control superconducting logic based devices. In certain examples, such microwave signals may be used to control quantum information, e.g., qubits. Certain examples further relate to reciprocal quantum logic (RQL) compatible phase shifters. Such RQL compatible phase-shifters may be used to generate microwave control signals for devices that may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance. Exemplary superconductors, such as Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be Aluminum Oxide barriers. In RQL circuits, in one example, the SIS type of junction may be part of a superconducting loop. The time integral of the potential difference between the two superconductors corresponds to a change in the magnetic flux through the loop by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates, include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates is based on the reciprocal data encoding mentioned earlier. As an example, a positive pulse changes the internal flux state of the inductive loop, but the trailing negative pulse erases the internal state every clock cycle, which in turn produces combinational logic behavior.

In general, microwave signals may be used to control superconducting logic based devices. In some examples, such microwave signals may be used to control the state of superconducting quantum bits (qubits). Many implementations of the gates, for superconducting quantum bits (qubits) require precise control of the amplitude and the phase of microwave signals. Examples consistent with this disclosure enable a superconducting integrated circuit that may have a phase shifter combined with superconducting logic on the same chip. Having the phase shifter on-chip allows integration of the phase shifter with the other on-chip superconducting logic, such as RQL gates. To ensure effective operation, the exemplary phase shifter may advantageously dissipate negligible energy on the chip. In addition, the exemplary phase shifter may advantageously allow more precise control of the phase over a wider range. Also, the exemplary phase shifter may advantageously have a wide operational bandwidth. In an alternative example, the phase shifter and the other superconducting logic may be part of a multi-chip package, e.g., a package-on-package, a system-in-package, or other types of multi-chip modules.

FIG. 1 shows a schematic diagram of an exemplary superconducting logic compatible phase shifter 100. Phase shifter 100 may include a superconducting circuit 112, a superconducting circuit 114, a current source 116, a current source 118, and a 90° hybrid coupler 140. Superconducting circuit 112 may include an inductor 120, a capacitor 122, and a Josephson junction 124. Capacitor 122 may be coupled in parallel to inductor 120 and Josephson junction 124. Superconducting circuit 114 may include an inductor 128, a capacitor 130, and a Josephson junction 132. Capacitor 130 may be coupled in parallel to inductor 128 and Josephson junction 132. Each of superconducting circuit 112 and superconducting circuit 114 may act as a variable reactive element. In one example, this is because, an amount of the current supplied by current source 116 to inductor 120 may change the inductance of Josephson junction 124. This is because the inductance of Josephson junction 124 may be a function of at least an amount of the current flow through inductor 120. This change in the inductance of Josephson junction 124 may cause a change in the resonance frequency of superconducting circuit 112. That, in turn, may change the phase of an input radio frequency signal (e.g., RF IN) in proportion to a change in the resonance frequency of superconducting circuit 112. Similarly, in one example, an amount of the current supplied by current source 118 to inductor 128 may change the inductance of Josephson junction 132. This is because the inductance of Josephson junction 132 may be a function of at least an amount of the current flow through inductor 128. This change in the inductance of Josephson junction 132 may cause a change in the resonance frequency of superconducting circuit 114. That, in turn, may change the phase of an input radio frequency signal (e.g., RF IN) in proportion to a change in the resonance frequency of superconducting circuit 114. Although not shown in FIG. 1, the current supplied by the two current sources may be inductively coupled to respective superconducting circuits 112 and 114 via an inductor.

With continued reference to FIG. 1, in one example, each of superconducting circuit 112 and superconducting circuit 114 may be a capacitively-shunted RF-SQUID. Each of capacitors 122 and 130 may provide the shunting functionality. The resonant frequency of each of the capacitively-shunted RF-SQUID circuits may be configured based on an amount of the current provided to these circuits. In one example, each of the capacitively-shunted RF-SQUID circuits may act as a variable reactance element because each of the Josephson junctions 124 and 132 may act as variable reactance (e.g., inductance) elements. As shown in FIG. 1, hybrid coupler 140 may have four terminals, such that a first terminal may be coupled to the terminal labeled IN, a second terminal may be coupled to the terminal labeled ISO, and a third terminal may be coupled to the terminal labeled 0°, and a fourth terminal may be coupled to the terminal labeled −90°. A RF IN signal received via the IN (input) terminal may be split between a 0° signal and −90° signal. The ISO (isolated) terminal may not receive any of the split signals. The variable reactance elements—superconducting circuit 112 and superconducting circuit 114—may reflect the entire signal received at the IN terminal and the reflected signal may be summed at the ISO terminal. In addition, the variable reactance elements—superconducting circuit 112 and superconducting circuit 114—may be tuned to cause a phase change in the received RF signal at the IN terminal and generate a phase-shifted RF signal at the ISO terminal. In one example, each of the variable reactance elements—superconducting circuit 112 and superconducting circuit 114—may act as a LC tank circuit. As a frequency of the RF IN signal passes through the natural resonant frequency of the LC tank circuit, the phase of the reflected signal may go through a full 360° rotation. The width of the rotation may be determined by the quality factor (Q) (the ratio of the loading impedance (e.g., 50Ω) to the characteristic impedance of the tank (square root of the inductance (L)/capacitance (C)) of the resonance. The resonant frequency of each of the variable reactance elements—superconducting circuit 112 and superconducting circuit 114—may be tuned by applying a DC current to each of these circuits. As an example, current source 116 and current source 118 may provide DC current to respective superconducting circuits 112 and 114 and thus tuning the resonant frequency of each of these circuits. In one example, the parameters (e.g., L and C values) of each of the RF-SQUID circuits may be chosen such that a maximum frequency and a minimum frequency of each of these circuits substantially overlaps with a bandwidth of the hybrid coupler (e.g., about one octave). As an example, the parameters of each of the RF-SQUID circuits may be chosen such that a maximum frequency and a minimum frequency of each of these circuits is commensurate with a bandwidth of the hybrid coupler (e.g., about one octave). In one example, the Q value of each of the RF-SQUID circuits may be selected to provide tuning greater than 180° over an entire octave.

Although FIG. 1 shows a certain number of components of phase shifter 100 arranged in a certain manner, there could be more or fewer number of components arranged differently. As an example, although FIG. 1 shows each of inductors 120 and 128 as a single inductor, each could be multiple inductors coupled in series or parallel to each other. Similarly, although FIG. 1 shows each of capacitors 122 and 130 as a single capacitor, each could be multiple capacitors coupled in series or parallel to each other. Also, although FIG. 1 shows each of Josephson junctions 124 and 132 as a single Josephson junction, each could be multiple Josephson junctions coupled in parallel to each other.

Figure 2:
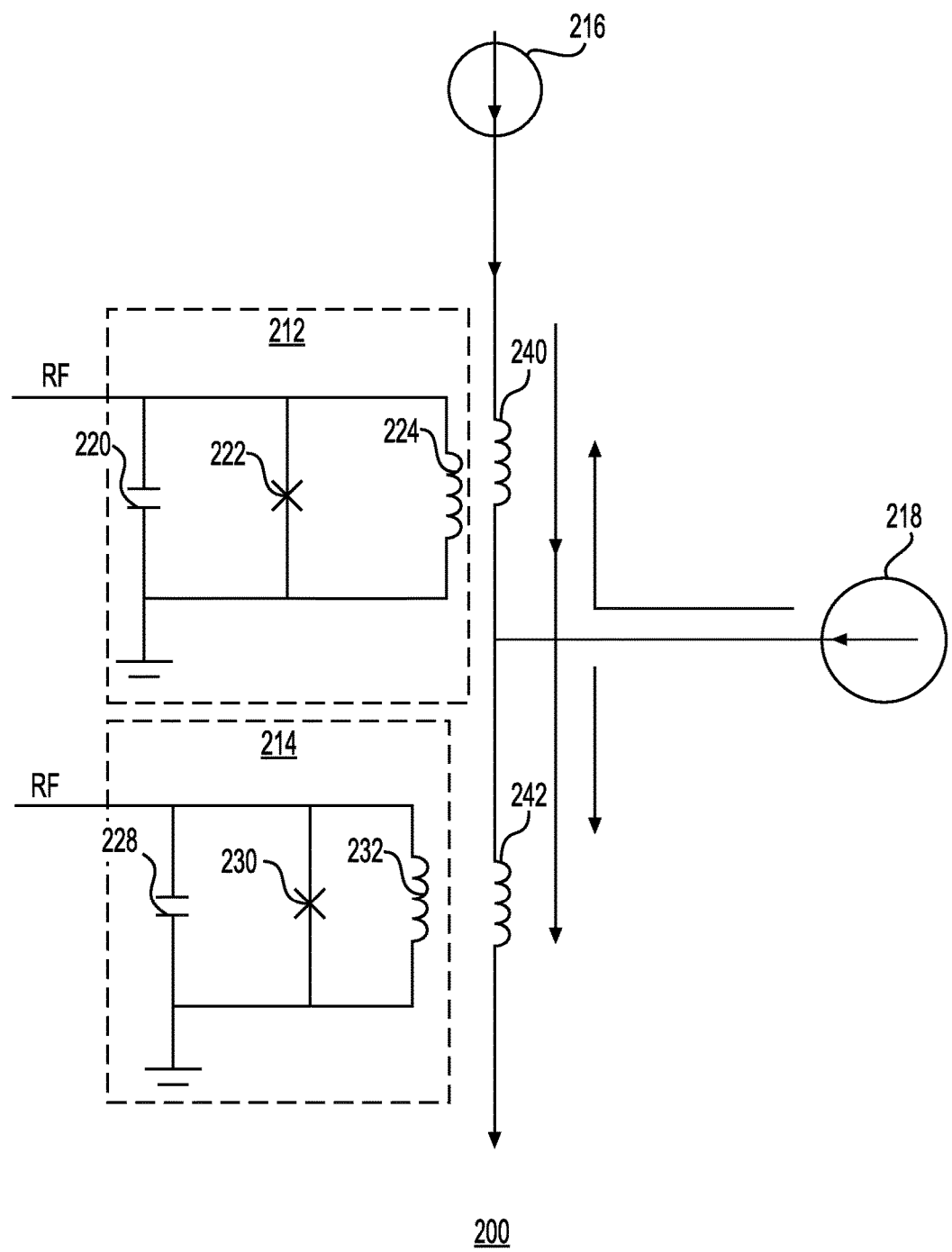
FIG. 2 shows a schematic diagram of an exemplary superconducting compatible logic phase shifter.

FIG. 2 is a schematic diagram of an exemplary superconducting logic compatible phase shifter 200. Phase shifter 200 may include a superconducting circuit 212, a superconducting circuit 214, a current source 216, and another current source 218. Superconducting circuit 212 may include a capacitor 220, a Josephson junction 222, and an inductor 224. Capacitor 220 may be coupled in parallel to Josephson junction 222 and inductor 224. Superconducting circuit 214 may include a capacitor 228, a Josephson junction 230, and an inductor 224. Capacitor 220 may be coupled in parallel to Josephson junction 230 and inductor 232. Current source 216 may act as a common tuning current and current source 218 may act as a differential tuning current to adjust for any imbalance between superconducting circuits 212 and 214. Currents generated by each of current source 216 and current source 218 may be coupled to superconducting circuit 212 inductively via inductor 240. Currents generated by each of current source 216 and current source 218 may be coupled to superconducting circuit 214 inductively via inductor 242. Each of superconducting circuit 212 and superconducting circuit 214 may act as a variable reactance element. In one example, this is because, an amount of the current supplied by current source 216 to inductor 224 (via magnetic coupling with inductor 240) may change the inductance of Josephson junction 222. This is because the inductance of Josephson junction 222 may be a function of at least an amount of the current flow through inductor 224. This change in the inductance of Josephson junction 222 may cause a change in the resonance frequency of superconducting circuit 212. That, in turn, may change the phase of an input radio frequency signal (e.g., RF IN) in proportion to a change in the resonance frequency of superconducting circuit 212. Similarly, in one example, an amount of the current supplied by current source 216 to inductor 232 (via magnetic coupling with inductor 240) may change the inductance of Josephson junction 230. This is because the inductance of Josephson junction 230 may be a function of at least an amount of the current flow through inductor 232. This change in the inductance of Josephson junction 230 may cause a change in the resonance frequency of superconducting circuit 214. That, in turn, may change the phase of an input radio frequency signal (e.g., RF IN) in proportion to a change in the resonance frequency of superconducting circuit 214.

With continued reference to FIG. 2, in one example, each of superconducting circuit 212 and superconducting circuit 214 may be a capacitively-shunted RF-SQUID. Each of capacitors 220 and 228 may provide the shunting functionality. The resonant frequency of each of the capacitively-shunted RF-SQUID circuits may be configured based on an amount of the current provided to these circuits. As discussed above, the current provided by current source 216 may act as a common tuning current and the current provided by current source 218 may act as a differential tuning current to adjust for any imbalance between superconducting circuits 212 and 214. Thus, as an example, an amount of the current supplied by current source 218 to inductor 224 (via magnetic coupling with inductor 240) may change the inductance of Josephson junction 222. This change in the inductance of Josephson junction 222 may cause a change in the resonance frequency of superconducting circuit 212. That, in turn, may change the phase of an input radio frequency signal (e.g., RF IN) in proportion to a change in the resonance frequency of superconducting circuit 212. Similarly, in one example, an amount of the current supplied by current source 218 to inductor 232 (via magnetic coupling with inductor 240) may change the inductance of Josephson junction 230. This change in the inductance of Josephson junction 230 may cause a change in the resonance frequency of superconducting circuit 214. That, in turn, may change the phase of an input radio frequency signal (e.g., RF IN) in proportion to a change in the resonance frequency of superconducting circuit 214. In one example, each of the capacitively-shunted RF-SQUID circuits may act as a variable reactance element because each of the Josephson junctions 222 and 230 may act as a variable reactance (inductance) element.

Although not shown in FIG. 2, a hybrid coupler may be coupled to receive the RF IN signal and provide the RF OUT signal. The hybrid coupler may have four terminals, such that a first terminal may be coupled to a terminal for receiving the RF IN signal, a second terminal may be coupled to provide the RF OUT signal, a third terminal may be coupled to superconducting circuit 212, and a fourth terminal may be coupled to superconducting circuit 214. The RF IN signal may be split between a 0° signal and −90° signal by the hybrid coupler. The variable reactance elements—superconducting circuit 212 and superconducting circuit 214—may reflect the entire RF IN signal and the reflected signal may be summed at the isolated port of the hybrid coupler and provided as the RF OUT signal. In addition, the variable reactance elements—superconducting circuit 212 and superconducting circuit 214—may be tuned to cause a phase change in the RF IN signal and generate a phase-shifted RF signal (RF OUT signal). In one example, each of the variable reactance elements—superconducting circuit 212 and superconducting circuit 214—may act as a LC tank circuit. As a frequency of the RF IN signal passes through the natural resonant frequency of the LC tank circuit, the phase of the reflected signal may go through a full 360° rotation. The width of the rotation may be determined by the quality factor (Q) of the resonance. Selecting a high-Q tank circuit may provide larger phase shifts over a narrower frequency band. On the other hand, selecting a low-Q tank circuit may provide smaller phase shifts over a wider frequency band. In the example described in FIG. 2, the impedance of the tank circuits may be selected to allow for greater than 180 degrees of tunability over an entire octave. The resonant frequency of each of the variable reactance elements—superconducting circuit 212 and superconducting circuit 214—may be tuned by applying a DC current to each of these circuits. As an example, current source 216 and current source 218 may provide a common current and a differential current, respectively, to each of these circuits and thus tune the resonant frequency of each of these circuits. In one example, the parameters (e.g., L and C values) of each of the RF-SQUID circuits may be chosen such that a maximum frequency and a minimum frequency of each of these circuits substantially overlaps with a bandwidth of the hybrid coupler (e.g., about one octave). As an example, the parameters of each of the RF-SQUID circuits may be chosen such that a maximum frequency and a minimum frequency of each of these circuits is commensurate with a bandwidth of the hybrid coupler (e.g., about one octave). In one example, the Q value of each of the RF-SQUID circuits may be selected to provide for tuning greater than 180° over an entire octave.

Although FIG. 2 shows a certain number of components of phase shifter 200 arranged in a certain manner, there could be more or fewer number of components arranged differently. As an example, although FIG. 2 shows each of inductors 224 and 232 as a single inductor, each could be multiple inductors coupled in series or parallel to each other. Similarly, although FIG. 2 shows each of capacitors 220 and 228 as a single capacitor, each could be multiple capacitors coupled in series or parallel to each other. Also, although FIG. 2 shows each of Josephson junctions 222 and 230 as a single Josephson junction, each could be multiple Josephson junctions coupled in series or parallel to each other.

Figure 3:
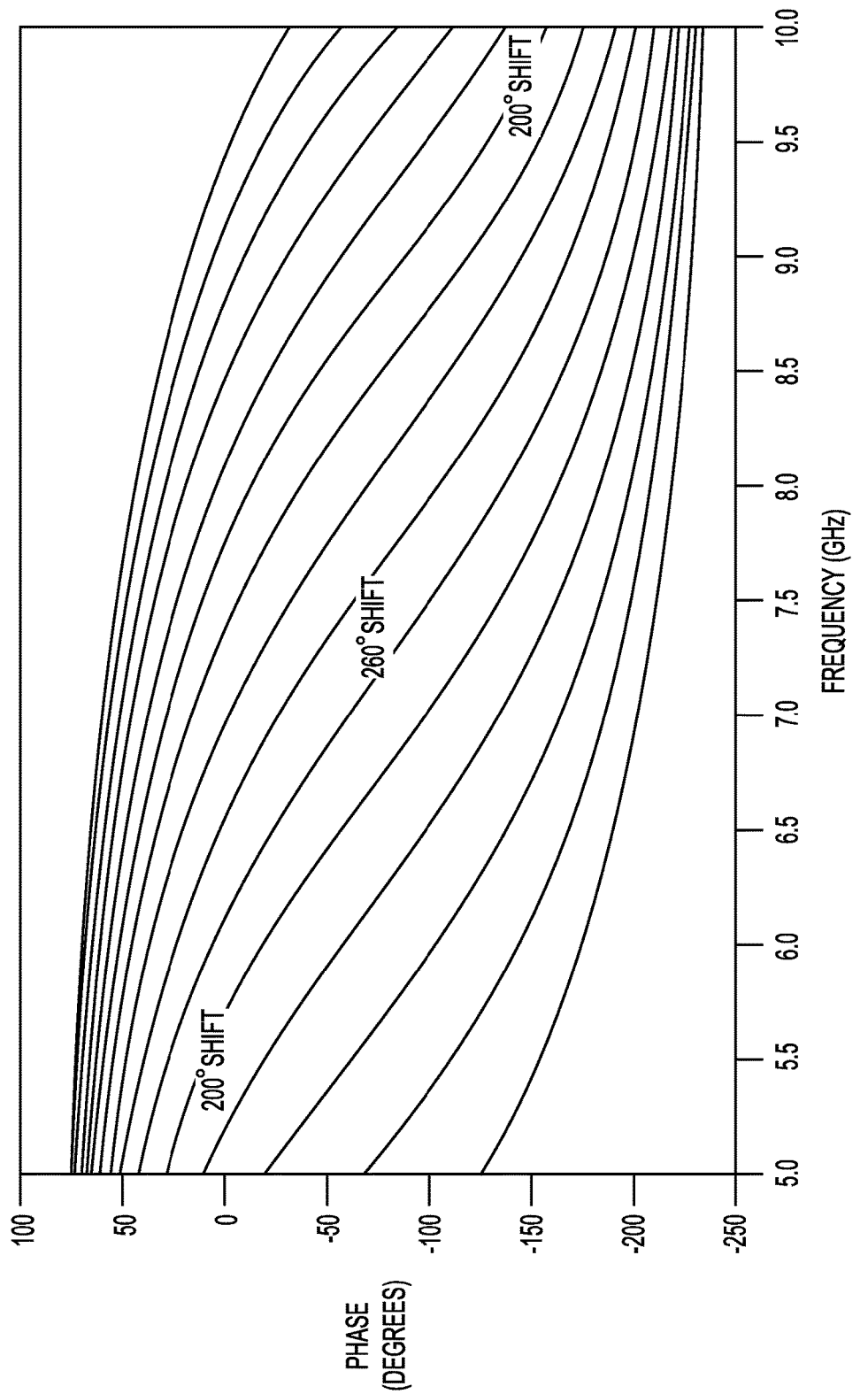
FIG. 3 shows a graph illustrating the change in the phase shift of an exemplary phase shifter based on a change in the frequency of a radio frequency signal.

FIG. 3 shows a graph 300 illustrating the change in the phase shift of an exemplary phase shifter (e.g., 100 of FIG. 1 or 200 of FIG. 2) based on a change in the frequency of a radio frequency signal input to the phase shifter. As an example, graph 300 shows a variation in the phase shift in degrees (Y-axis) based on a change in the frequency (X-axis) of the radio frequency signal input to the phase shifter. Each line represents a different tuning current supplied to the RF-SQUID circuits of the phase shifter (e.g., 100 of FIG. 1 or 200 of FIG. 2), which provide the variation in the phase at a given frequency. In this example, the phase shifter is designed to provide the highest amount of phase shift at a frequency of 7.5 GHz.

Figure 4:
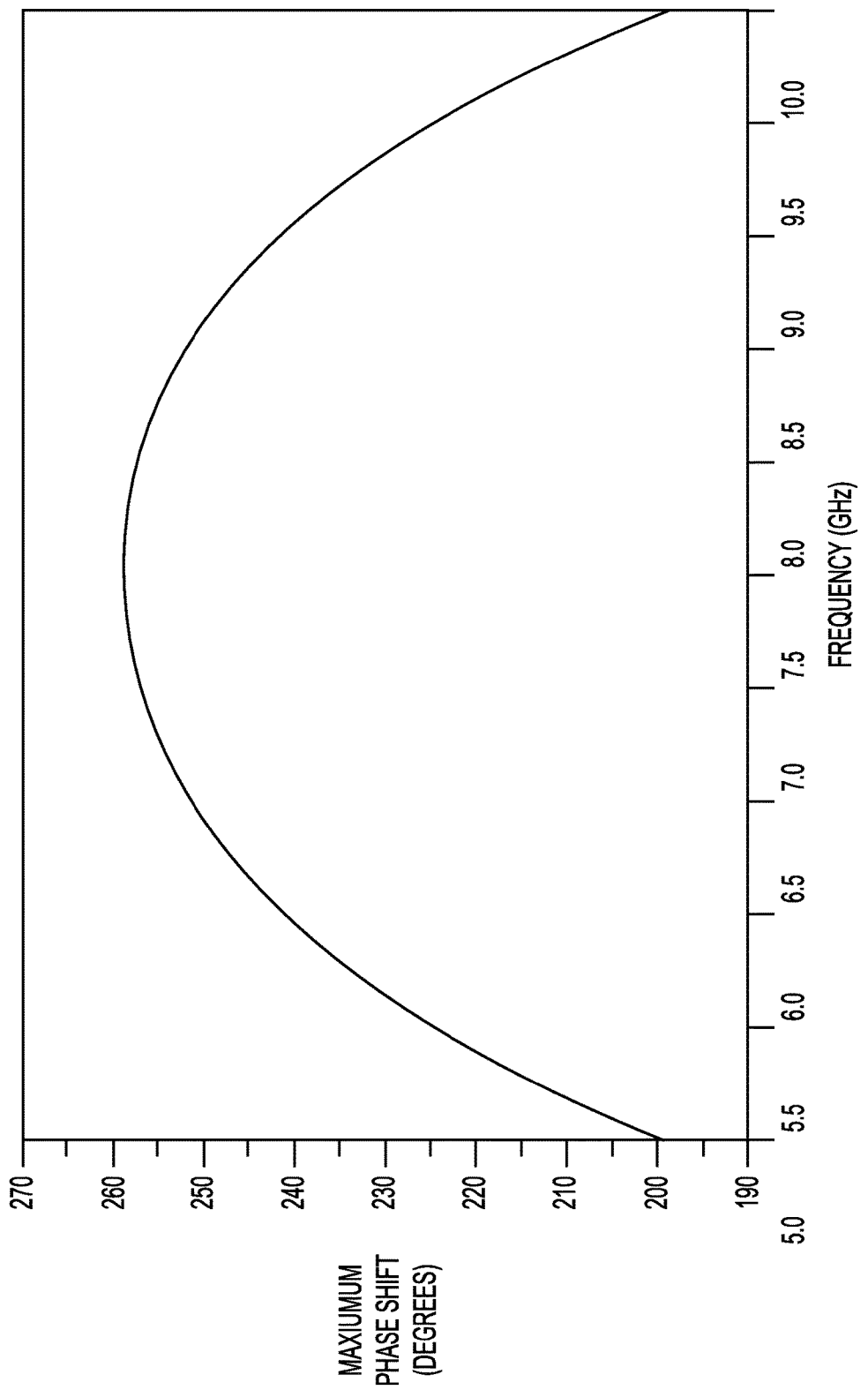
FIG. 4 shows a graph illustrating the maximum phase shift of an exemplary phase shifter based on a change in the frequency of a radio frequency signal.

FIG. 4 shows a graph illustrating the maximum phase shift of an exemplary phase shifter (e.g., 100 of FIG. 1 or 200 of FIG. 2) based on a change in the frequency of a radio frequency signal input to the phase shifter. As an example, graph 400 shows a variation in the maximum phase shift in degrees (Y-axis) based on a change in the frequency (X-axis) of the radio frequency signal input to the phase shifter. The maximum phase shift is achieved by tuning current supplied to the RF-SQUID circuits of the phase shifter (e.g., 100 of FIG. 1 or 200 of FIG. 2), which provide the variation in the phase at a given frequency. In this example, the phase shifter is designed to provide the highest amount of maximum phase shift at a frequency of 7.5 GHz. As discussed earlier, the phase shifter (e.g., 100 of FIG. 1 or 200 of FIG. 2) may be tuned by changing an amount of the current supplied to the RF-SQUID circuits of the phase shifter.

Figure 5:
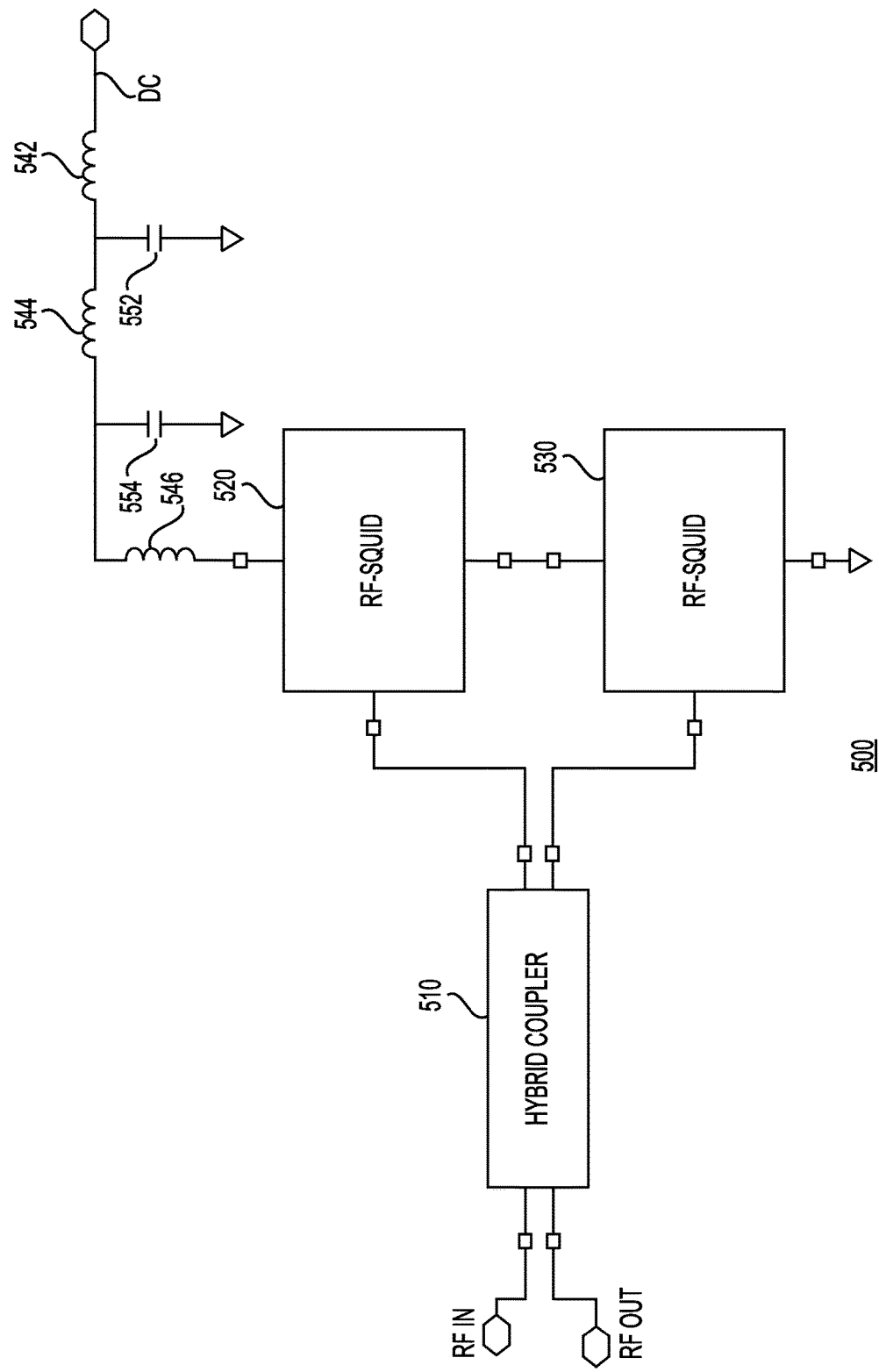
FIG. 5 shows a schematic diagram of an exemplary superconducting logic compatible phase shifter.

FIG. 5 shows a schematic diagram of an exemplary superconducting logic compatible phase shifter 500. Phase shifter 500 may include a hybrid coupler 510, a RF-SQUID circuit 520, another RF-SQUID circuit 530 and a terminal for receiving a DC current. The DC current may be filtered using inductors 542, 544, and 546 and capacitors 552 and 554 or any other low-pass filter implementation. Each of RF-SQUID circuit 520 and RF-SQUID circuit 530 may be a capacitively-shunted RF-SQUID. In one example, RF-SQUID circuit 520 may include similar components as superconducting circuit 112 of FIG. 1 and RF-SQUID circuit 530 may include similar components as superconducting circuit 114 of FIG. 1. The resonant frequency of each of the capacitively-shunted RF-SQUID circuits may be configured based on an amount of the DC current provided to these circuits. In one example, each of the capacitively-shunted RF-SQUID circuits may act as a variable reactive element because each of the Josephson junctions in these circuits may act as variable reactance (e.g., inductance) elements. Hybrid coupler 510 may have four terminals, such that a first terminal may be coupled to the terminal for receiving the RF IN signal, a second terminal may be coupled to the terminal for providing the RF OUT signal, a third terminal may be coupled to RF-SQUID circuit 520, and a fourth terminal may be coupled to RF-SQUID circuit 530. The RF IN signal may be split between a 0° signal and −90° signal. The terminal for providing the RF OUT signal may not receive any of the split signals. The variable reactance elements—each of the superconducting circuits in the RF-SQUID circuits—may reflect the entire RF IN signal and the reflected signal may be summed to provide the RF OUT signal at the second terminal of hybrid coupler 510. In addition, the variable reactance elements may be tuned to cause a phase change in the received RF signal to generate a phase-shifted RF OUT signal. In one example, each of the variable reactance elements may act as a LC tank circuit. As a frequency of the RF IN signal passes through the natural resonant frequency of the LC tank circuit, the phase of the reflected signal may go through a full 360° rotation. The width of the rotation may be determined by the quality factor (Q) of the resonance. Selecting a high-Q tank circuit may provide larger phase shifts over a narrower frequency band. On the other hand, selecting a low-Q tank circuit may provide smaller phase shifts over a wider frequency band. In the example described in FIG. 5, the impedance of the tank circuits may be selected to allow for greater than 180 degrees of tunability over an entire octave. The resonant frequency of each of the variable reactance elements may be tuned by applying the DC current to each of these circuits. In one example, the parameters (e.g., L and C values) of each of the RF-SQUID circuits may be chosen such that a maximum frequency and a minimum frequency of each of these circuits is commensurate with a bandwidth of the hybrid coupler (e.g., about one octave). In one example, the Q value of each of the RF-SQUID circuits may be selected to provide maximum precision while still allowing for tuning greater than 180° over an entire octave.

Although FIG. 5 shows a certain number of components of phase shifter 500 arranged in a certain manner, there could be more or fewer number of components arranged differently. As an example, although FIG. 5 shows specific inductors and capacitors arranged to filter the DC current, there could be a different filter arrangement.

Figure 6:
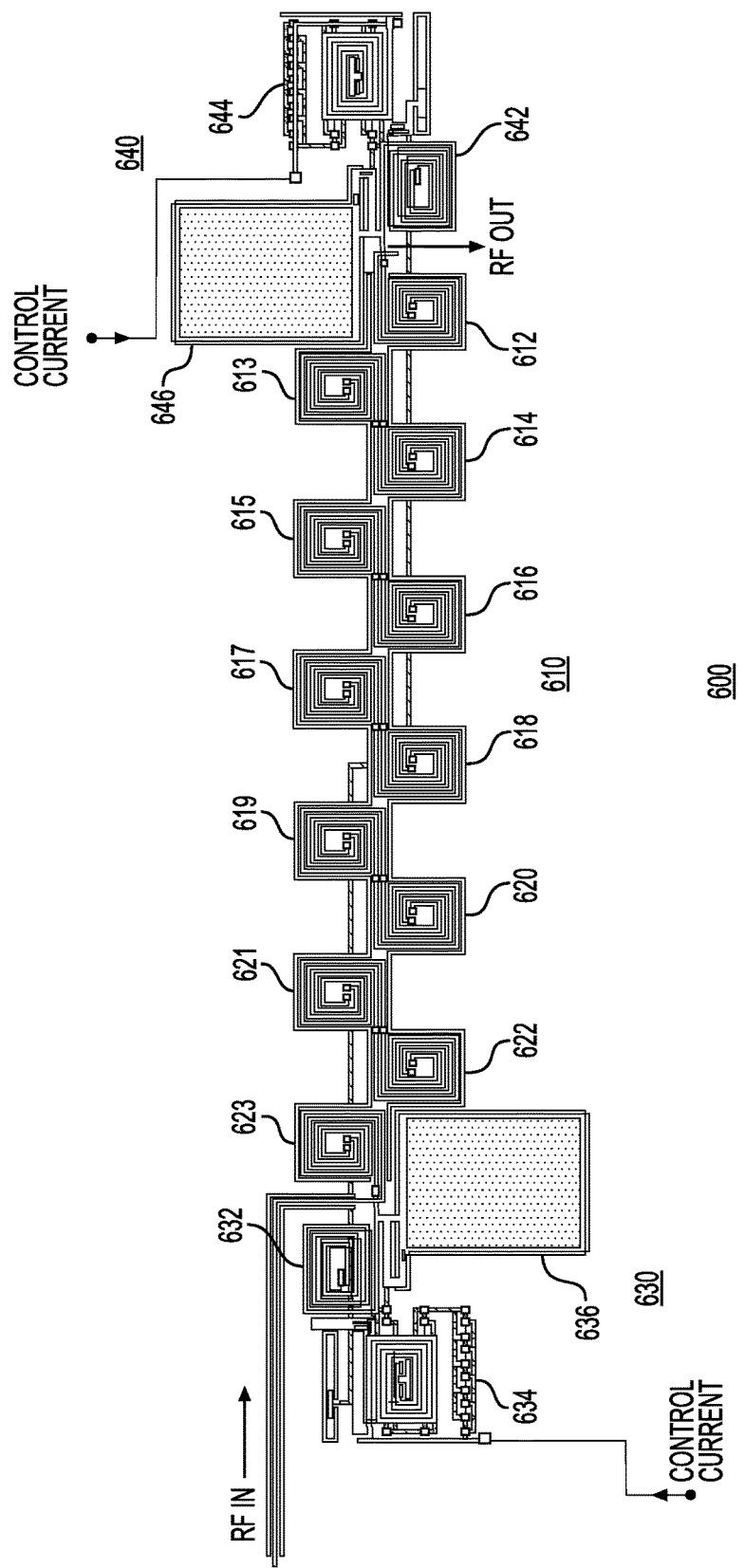
FIG. 6 shows a layout of an exemplary superconducting logic compatible phase shifter.

FIG. 6 shows a schematic diagram of layout 600 of an exemplary superconducting logic compatible phase shifter (e.g., FIG. 1, FIG. 2, or FIG. 5). As shown in FIG. 6, hybrid coupler layout 610 may include multiple stacked inductive coils 612, 613, 614, 615, 616, 617, 618, 619, 620, 621, 622, and 623. The number of such stacked inductive coils may be selected as a function of the center frequency of the radio frequency signal that needs to be phase-shifted. Hybrid coupler layout 610 further shows four terminals: (1) for receiving a radio frequency signal (RF IN), (2) for providing a phase-shifted radio frequency signal (RF OUT), (3) for coupling the hybrid coupler to a first superconducting circuit, and (4) for coupling the hybrid coupler to a second superconducting circuit. In addition, a CONTROL CURRENT may be received (as shown in FIG. 6) and coupled to both superconducting circuits. According to one example, superconducting circuit layout 630 may include inductors 632, Josephson junctions 634, and capacitors 636 coupled in parallel to each other. According to one example, supercon-ducting circuit layout 640 may include inductors 642, Josephson junctions 644, and capacitors 646 coupled in parallel to each other. As discussed earlier, with respect to FIG. 1, FIG. 2, and FIG. 5, superconducting logic compatible phase shifter, whose exemplary layout 600 is shown in FIG. 6, may be used to phase shift an incoming radio frequency signal. Although FIG. 6 shows a specific layout, the phase shifter components may be laid out differently and the phase shifter may include additional or fewer components. As an example, both a common control current and a differential control current may be provided (e.g., similar to as in FIG. 2).

Figure 7:
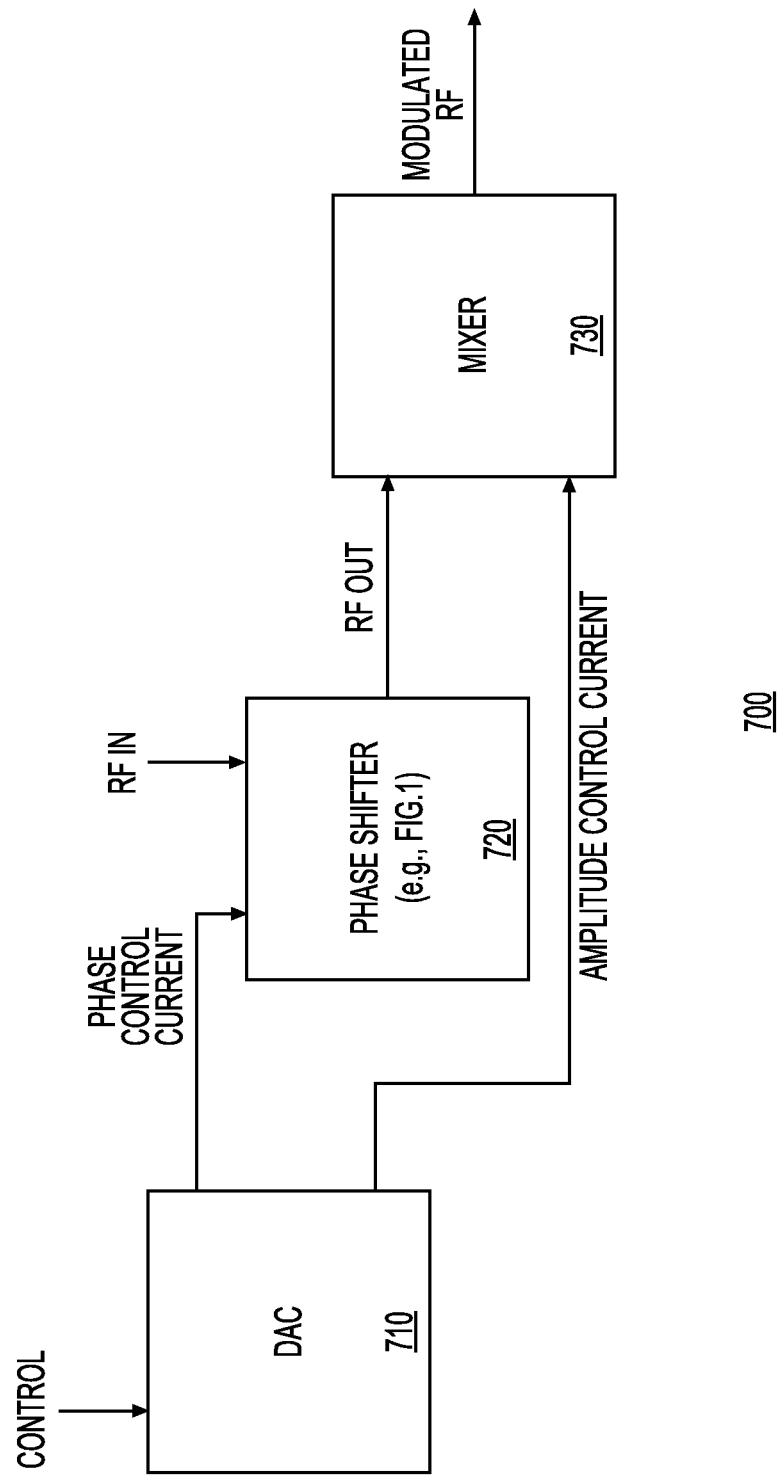
FIG. 7 shows a block diagram of a device for controlling superconducting logic based devices.

In accordance with one example, FIG. 7 shows a block diagram of a device 700 for vector modulation of a microwave signal. Such a device may be used, for example, for controlling the state of qubits. Quantum operations may be performed by microwave pulses of certain frequencies, amplitudes, and phases. A state of qubit may be represented by a state vector on the Bloch sphere. An exemplary state vector corresponding to the state of a qubit may be represented as $|\psi\rangle = \alpha|0\rangle + \beta|1\rangle$, such that the qubit can be described as a linear combination of $|0\rangle$ and $|1\rangle$, where $\alpha$ and $\beta$ are complex probability amplitudes. In one example, the qubit may be in one state or the other and thus the total probability of all possible outcomes must be 1. In other words, $\alpha$ and $\beta$ are constrained by $|\alpha|^2 + |\beta|^2 = 1$. For performing gate operations on qubits and reading the state of qubits, microwave pulses may be used. Precise control over such microwave pulses may require controlling both the phase and the amplitude of such pulses with accuracy. Device 700 may also be used for controlling microwave signals for chip-to-chip or package-to-package communications. In addition, device 700 may also be used for controlling front-end receivers in applications, such as radio astronomy.

With continued reference to FIG. 7, device 700 may include a digital to analog converter (DAC) 710, a phase shifter 720 (e.g., phase shifter 100 of FIG. 1), and a mixer 730. DAC 710 may receive digital control signals (e.g., CONTROL of FIG. 7) via an input. The digital control signals may be converted into two analog signals—a PHASE CONTROL CURRENT and an AMPLITUDE CONTROL CURRENT. PHASE CONTROL CURRENT may be supplied to phase shifter 710. Phase shifter 710 may also receive a radio frequency signal (RF IN) as an input. As discussed earlier with respect to exemplary phase shifters described in FIG. 1, FIG. 2, and FIG. 5, the current supplied to phase shifter 720 may be used to tune variable reactance elements in the phase shifter to produce a phase shifted signal (e.g., RF OUT). Mixer 730 may receive the RF OUT signal and may receive the AMPLITUDE CONTROL CURRENT. In response, mixer 730 may modulate the RF OUT signal to generate the MODULATED RF signal. In one example, mixer 730 may be a double-balanced mixer. Mixer 730 may also include variable reactance circuits that may be used to vary an amplitude of a radio frequency signal based on the input control current. Mixer 730 may provide a MODULATED RF signal that may be used to control qubits or signals for use with the various example applications discussed earlier. In addition, any superconducting device operating in a cryogenic environment and requiring modulated microwave signals may include device 700. Furthermore, DAC 710 need not be in a cryogenic environment; instead, it may operate at non-cryogenic temperatures. In this example, phase shifter 720 and mixer 730 may be in a separate cryogenic environment and may be coupled via connectors to DAC 710 in a way that the cryogenic environment can be maintained. Device 700 may be used as part of computing units in a data center for delivering cloud-based services, such as software as a service, platform as a service, or other services.

In conclusion, a phase shifter is provided. The phase shifter may include: (1) a first superconducting circuit including at least a first capacitor coupled in parallel to at least a first Josephson junction and at least a first inductor coupled in parallel to the at least the first Josephson junction, where an inductance of the at least the first Josephson junction is a function of at least an amount of a first current flow through the at least the first inductor, and (2) at least a second capacitor coupled in parallel to at least a second Josephson junction and at least a second inductor coupled in parallel to the at least the second Josephson junction, where an inductance of the at least the second Josephson junction is a function of at least an amount of a second current flow through the at least the first inductor. An effect of any or both of: (1) at least the inductance of the at least the first Josephson junction and (2) at least the inductance of the at least the second Josephson junction causes a phase change of a radio frequency signal received at a first terminal of the phase shifter to generate a phase-shifted radio frequency signal at a second terminal of the phase shifter. The phase-shifted radio frequency signal may be a microwave control signal for controlling at least one superconducting logic based device.

Each of the first and the second superconducting circuits may be a capacitively-shunted RF-SQUID circuit, where a resonant frequency of each of these circuits may be configured based on an amount of current flow through such circuits. The phase shifter may further include a 90° hybrid coupler comprising: (1) a third terminal coupled to the first terminal of the phase shifter, (2) a fourth terminal coupled to the second terminal of the phase shifter, (3) a fifth terminal coupled to the first capacitively-shunted RF-SQUID circuit, and (4) a sixth terminal coupled to the second capacitively-shunted RF-SQUID circuit. For the phase shifter, each of a first plurality of parameters corresponding to the first capacitively-shunted RF-SQUID circuit and a second plurality of parameters corresponding to the second capacitively-shunted RF-SQUID circuit may be selected such that a first maximum frequency of each of the first capacitively-shunted RF-SQUID circuit and the second capacitively-shunted RF-SQUID circuit and a first minimum frequency of each of the first capacitively-shunted RF-SQUID circuit and the second capacitively-shunted RF-SQUID circuit substantially overlaps with a bandwidth of the hybrid coupler.

In another aspect, a superconducting integrated circuit including a phase shifter and a mixer is provided. The phase shifter may include a first superconducting circuit and a second superconducting circuit. The first superconducting circuit may further include at least a first capacitor coupled in parallel to at least a first Josephson junction and at least a first inductor coupled in parallel to the at least the first Josephson junction, where an inductance of the at least the first Josephson junction is a function of at least a first portion of a phase control current flow through the at least the first inductor. The second superconducting circuit may include at least a second capacitor coupled in parallel to at least a second Josephson junction and at least a second inductor coupled in parallel to the at least the second Josephson junction, where an inductance of the at least the second Josephson junction is a function of at least a second portion of the phase control current flow through the at least the second inductor. An effect of any or both of: (1) at least the inductance of the at least the first Josephson junction and (2) at least the inductance of the at least the second Josephson junction causes a phase change of a radio frequency signal received at a first terminal of the phase shifter to generate a phase-shifted radio frequency signal at a second terminal of the phase shifter. The mixer may receive the phase-shifted radio frequency signal at a first terminal of the mixer and an amplitude control current at a second terminal of the mixer and may provide a qubit control signal at a third terminal of the mixer. The control signal may be a microwave control signal for controlling at least one superconducting logic based device. The control signal may also be a qubit control signal, for controlling at least one state of at least one qubit Each of the first and the second superconducting circuits may be a capacitively-shunted RF-SQUID circuit. A first resonant frequency of the first capacitively-shunted RF-SQUID circuit may be configured based at least on the amount of the first portion of the phase control current flow and wherein a second resonant frequency of the second capacitively-shunted RF-SQUID circuit may be configured based at least on the amount of the second portion of the phase control current flow. The superconducting integrated circuit may further include a 90° hybrid coupler comprising: (1) a third terminal coupled to the first terminal of the phase shifter, (2) a fourth terminal coupled to the second terminal of the phase shifter, (3) a fifth terminal coupled to the first capacitively-shunted RF-SQUID circuit, and (4) a sixth terminal coupled to the second capacitively-shunted RF-SQUID circuit. Each of a first plurality of parameters corresponding to the first capacitively-shunted RF-SQUID circuit and a second plurality of parameters corresponding to the second capacitively-shunted RF-SQUID circuit, may be selected such that a first maximum frequency of each of the first capacitively-shunted RF-SQUID circuit and the second capacitively-shunted RF-SQUID circuit and a first minimum frequency of each of the first capacitively-shunted RF-SQUID circuit and the second capacitively-shunted RF-SQUID circuit substantially overlaps a bandwidth of the 90° hybrid coupler. The superconducting integrated circuit may further be coupled to a digital to analog converter for: (1) receiving a digital control signal, (2) converting the digital control signal into the phase control current, and (3) providing the phase control current to the phase shifter In yet another aspect, a phase shifter including a hybrid coupler, a first variable reactance circuit, and a second variable reactance circuit is provided. The hybrid coupler may include a first terminal, a second terminal, a third terminal, and a fourth terminal. The first variable reactance circuit, coupled to the first terminal of the hybrid coupler, may include at least a first capacitor coupled in parallel to at least a first Josephson junction, at least a first inductor coupled in parallel to at least the first Josephson junction, wherein the at least the first inductor is magnetically coupled to at least a second inductor such that a first combined effect of a common current and a differential current supplied to the at least the second inductor causes a first change in an inductance of the at least the first Josephson junction. The second variable reactance circuit, coupled to the second terminal of the hybrid coupler, may include at least a second capacitor coupled in parallel to at least a second Josephson junction, at least a third inductor coupled in parallel to at least the second Josephson junction, wherein the at least the third inductor is magnetically coupled to the at least a fourth inductor such that a second combined effect of the common current and the differential current supplied to the at least the fourth inductor causes a second change in an inductance of the at least the second Josephson junction. An effect of any or both of: (1) at least the first change in the inductance of the at least the first Josephson junction, and (2) at least the second change in the inductance of the at least the second Josephson junction may cause a phase change of a radio frequency signal received via the third terminal of the hybrid coupler to provide a phase-shifted radio frequency signal via the fourth terminal of the hybrid coupler.

Each of the variable reactance circuits may be a capacitively-shunted RF-SQUID circuit. A first resonant frequency of the first capacitively-shunted RF-SQUID circuit may be configured based at least on an amount of the common current and an amount of the differential current and wherein a second resonant frequency of the second capacitively-shunted RF-SQUID circuit may be configured based at least on an amount of the common current and an amount of the differential current. Each of a first plurality of parameters corresponding to the first capacitively-shunted RF-SQUID circuit and a second plurality of parameters corresponding to the second capacitively-shunted RF-SQUID circuit, may be selected such that a first maximum frequency of each of the first capacitively-shunted RF-SQUID circuit and the second capacitively-shunted RF-SQUID circuit and a first minimum frequency of each of the first capacitively-shunted RF-SQUID circuit and the second capacitively-shunted RF-SQUID circuit substantially overlaps a bandwidth of the 90° hybrid coupler.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as device 700, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting device comprising:
  a phase shifter;
  a digital to analog converter configured to receive a digital control signal and generate a phase control signal based on the digital control signal and supply the phase control signal to the phase shifter via a first terminal of the phase shifter; and
  the phase shifter comprising:
    a first superconducting circuit comprising:
      at least a first capacitor coupled in parallel to at least a first Josephson junction and at least a first inductor coupled in parallel to the at least the first Josephson junction, wherein an inductance of the at least the first Josephson junction is a function of at least an amount of a first current flow through the at least the first inductor, wherein the first current flow is generated in response to at least a first current supplied by a first current source, and
    a second superconducting circuit comprising:
      at least a second capacitor coupled in parallel to at least a second Josephson junction and at least a second inductor coupled in parallel to the at least the second Josephson junction, wherein an inductance of the at least the second Josephson junction is a function of at least an amount of a second current flow through the at least the second inductor, wherein the second current flow is generated in response to at least a second current supplied by a second current source different from the first current source, and wherein at least an effect of any or both of: (1) at least the inductance of the at least the first Josephson junction and (2) at least the inductance of the at least the second Josephson junction causes a phase change of a radio frequency signal received at a second terminal of the phase shifter to generate a phase-shifted radio frequency signal at a third terminal of the phase shifter.

2. The superconducting device of claim 1, wherein the first superconducting circuit comprises a first capacitively-shunted RF-SQUID circuit.

3. The superconducting device of claim 2, wherein the second superconducting circuit comprises a second capacitively-shunted RF-SQUID circuit.

4. The superconducting device of claim 3, wherein a first resonant frequency of the first capacitively-shunted RF-SQUID circuit is configured based at least on the amount of the first current flow.

5. The superconducting device of claim 4, wherein a second resonant frequency of the second capacitively-shunted RF-SQUID circuit is configured based at least on the amount of the second current flow.

6. The superconducting device of claim 3 further comprising a 90° hybrid coupler comprising: (1) a third terminal coupled to the first terminal of the phase shifter, (2) a fourth terminal coupled to the second terminal of the phase shifter, (3) a fifth terminal coupled to the first capacitively-shunted RF-SQUID circuit, and (4) a sixth terminal coupled to the second capacitively-shunted RF-SQUID circuit.

7. The superconducting device of claim 6, wherein each of a first plurality of parameters corresponding to the first capacitively-shunted RF-SQUID circuit and a second plurality of parameters corresponding to the second capacitively-shunted RF-SQUID circuit is selected such that a maximum frequency of each of the first capacitively-shunted RF-SQUID circuit and the second capacitively-shunted RF-SQUID circuit and a minimum frequency of each of the first capacitively-shunted RF-SQUID circuit and the second capacitively-shunted RF-SQUID circuit substantially overlaps with a bandwidth of the hybrid coupler.

8. The superconducting device of claim 1, wherein the phase-shifted radio frequency signal is a microwave control signal for controlling at least one superconducting logic based device.

9. A superconducting integrated circuit comprising:
a phase shifter, the phase shifter comprising:
a first superconducting circuit comprising:
at least a first capacitor coupled in parallel to at least a first Josephson junction and at least a first inductor coupled in parallel to the at least the first Josephson junction, wherein an inductance of the at least the first Josephson junction is a function of at least a first portion of a phase control current flow through the at least the first inductor, and
a second superconducting circuit comprising:
at least a second capacitor coupled in parallel to at least a second Josephson junction and at least a second inductor coupled in parallel to the at least the second Josephson junction, wherein an inductance of the at least the second Josephson junction is a function of at least a second portion of the phase control current flow through the at least the second inductor, and wherein at least an effect of any or both of: (1) at least the inductance of the at least the first Josephson junction and (2) at least the inductance of the at least the second Josephson junction causes a phase change of a radio frequency signal received at a first terminal of the phase shifter to generate a phase-shifted radio frequency signal at a second terminal of the phase shifter; and a mixer for receiving the phase-shifted radio frequency signal at a first terminal of the mixer and an amplitude control current at a second terminal of the mixer and for providing a modulated radio frequency signal at a third terminal of the mixer.

10. The superconducting integrated circuit of claim 9, wherein the first superconducting circuit comprises a first capacitively-shunted RF-SQUID circuit and wherein the second superconducting circuit comprises a second capacitively-shunted RF-SQUID circuit.

11. The superconducting integrated circuit of claim 10, wherein a first resonant frequency of the first capacitively-shunted RF-SQUID circuit is configured based at least on the amount of the first portion of the phase control current flow and wherein a second resonant frequency of the second capacitively-shunted RF-SQUID circuit is configured based at least on the amount of the second portion of the phase control current flow.

12. The superconducting integrated circuit of claim 10 further comprising a 90° hybrid coupler comprising: (1) a third terminal coupled to the first terminal of the phase shifter, (2) a fourth terminal coupled to the second terminal of the phase shifter, (3) a fifth terminal coupled to the first capacitively-shunted RF-SQUID circuit, and (4) a sixth terminal coupled to the second capacitively-shunted RF-SQUID circuit.

13. The superconducting integrated circuit of claim 10, wherein each of a first plurality of parameters corresponding to the first capacitively-shunted RF-SQUID circuit and a second plurality of parameters corresponding to the second capacitively-shunted RF-SQUID circuit, is selected such that a maximum frequency of each of the first capacitively-shunted RF-SQUID circuit and the second capacitively-shunted RF-SQUID circuit and a minimum frequency of each of the first capacitively-shunted RF-SQUID circuit and the second capacitively-shunted RF-SQUID circuit substantially overlaps a bandwidth of the 90° hybrid coupler.

14. The superconducting integrated circuit of claim 9, wherein the modulated radio frequency signal is a microwave control signal for controlling at least one superconducting logic based device.

15. The superconducting integrated circuit of claim 9 further coupled to a digital to analog converter for: (1) receiving a digital control signal, (2) converting the digital control signal into the phase control current, and (3) providing the phase control current to the phase shifter.

16. The superconducting integrated circuit of claim 9, wherein the modulated radio frequency signal is a qubit control signal for controlling at least one state of at least one qubit.

17. A phase shifter comprising:
a 90° hybrid coupler comprising a first terminal, a second terminal, a third terminal, and a fourth terminal;
a first variable reactance circuit, coupled to the first terminal of the hybrid coupler, comprising:
at least a first capacitor coupled in parallel to at least a first Josephson junction, at least a first inductor coupled in parallel to at least the first Josephson junction, wherein the at least the first inductor is magnetically coupled to at least a second inductor such that a first combined effect of a common tuning current and a differential current supplied to the at least the second inductor causes a first change in an inductance of the at least the first Josephson junction; and
a second variable reactance circuit, coupled to the second terminal of the hybrid coupler, comprising:

at least a second capacitor coupled in parallel to at least a second Josephson junction, at least a third inductor coupled in parallel to at least the second Josephson junction, wherein the at least the third inductor is magnetically coupled to the at least a fourth inductor such that a second combined effect of the common current and the differential current supplied to the at least the fourth inductor causes a second change in an inductance of the at least the second Josephson junction, wherein at least an effect of any or both of: (1) at least the first change in the inductance of the at least the first Josephson junction, and (2) at least the second change in the inductance of the at least the second Josephson junction, causes a phase change of a radio frequency signal received via the third terminal of the hybrid coupler to provide a phase-shifted radio frequency signal via the fourth terminal of the hybrid coupler.

18. The phase shifter of claim 17, wherein the first variable reactance circuit comprises a first capacitively-shunted RF-SQUID circuit and wherein the second variable reactance circuit comprises a second capacitively-shunted RF-SQUID circuit.

19. The phase shifter of claim 18, wherein a first resonant frequency of the first capacitively-shunted RF-SQUID circuit is configured based at least on an amount of the common current and an amount of the differential current and wherein a second resonant frequency of the second capacitively-shunted RF-SQUID circuit is configured based at least on an amount of the common current and an amount of the differential current.

20. The phase shifter of claim 18, wherein each of a first plurality of parameters corresponding to the first capacitively-shunted RF-SQUID circuit and a second plurality of parameters corresponding to the second capacitively-shunted RF-SQUID circuit, is selected such that a maximum frequency of each of the first capacitively-shunted RF-SQUID circuit and the second capacitively-shunted RF-SQUID circuit and a minimum frequency of each of the first capacitively-shunted RF-SQUID circuit and the second capacitively-shunted RF-SQUID circuit substantially overlaps a bandwidth of the 90° hybrid coupler.

* * * * *